(12) United States Patent
Yoshida et al.

(10) Patent No.: US 10,892,569 B2
(45) Date of Patent: Jan. 12, 2021

(54) ELECTRICAL CONNECTION BOX AND GROUND CONNECTION STRUCTURE THEREOF

(71) Applicant: Yazaki Corporation, Tokyo (JP)

(72) Inventors: Naoyuki Yoshida, Makinohara (JP); Jin Watanabe, Makinohara (JP); Shouya Shinogaya, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 16/592,179

(22) Filed: Oct. 3, 2019

(65) Prior Publication Data
US 2020/0112108 A1 Apr. 9, 2020

(30) Foreign Application Priority Data

Oct. 3, 2018 (JP) .................................. 2018-188540

(51) Int. Cl.
| | | |
|---|---|---|
| *H01R 13/648* | (2006.01) | |
| *H01R 4/30* | (2006.01) | |
| *H05K 1/02* | (2006.01) | |
| *H02G 3/08* | (2006.01) | |
| *B60R 16/023* | (2006.01) | |

(52) U.S. Cl.
CPC ............ *H01R 4/308* (2013.01); *H02G 3/081* (2013.01); *H05K 1/0215* (2013.01); *B60R 16/0238* (2013.01)

(58) Field of Classification Search
CPC ........ H01R 4/308; H01R 4/64; H05K 1/0215; H05K 2201/09127; H05K 2203/1327; H05K 2201/1034; H05K 3/284; H05K 5/02; H02G 3/081; B60R 16/0238

USPC ........................................................ 439/76.1
See application file for complete search history.

(56) References Cited

U.S. PATENT DOCUMENTS

| 5,966,439 | A | * | 10/1999 | Clavel | H04Q 1/20 |
| | | | | | 379/413.04 |
| 6,033,239 | A | * | 3/2000 | Jaakkola | H01R 25/145 |
| | | | | | 439/121 |
| 6,283,765 | B1 | * | 9/2001 | Lumbis | B60T 13/665 |
| | | | | | 439/35 |
| 6,403,880 | B1 | * | 6/2002 | Elford | H02G 3/081 |
| | | | | | 174/135 |
| 6,652,295 | B1 | * | 11/2003 | Glass | H01R 9/2483 |
| | | | | | 439/92 |

(Continued)

FOREIGN PATENT DOCUMENTS

| JP | H06-031327 U | 4/1994 |
| JP | 2003-260992 A | 9/2003 |

(Continued)

*Primary Examiner* — Abdullah A Riyami
*Assistant Examiner* — Nelson R. Burgos-Guntin
(74) *Attorney, Agent, or Firm* — Banner & Witcoff, Ltd.

(57) ABSTRACT

An electrical connection box includes: a box main body; an electric circuit body loaded into the box main body; a grounding member provided in the electric circuit body; a belt-like grounding metal plate extending from the grounding member to the outside of the box main body; a fixing bracket extending integrally with the box main body and including the grounding metal plate; and a bolt through hole formed through a tip end portion of the fixing bracket to electrically connect the grounding metal plate to a bolt to be inserted.

5 Claims, 5 Drawing Sheets

(56) References Cited

U.S. PATENT DOCUMENTS

| | | | |
|---|---|---|---|
| 7,381,065 B2 * | 6/2008 | Ikeda | H05K 7/026 |
| | | | 439/76.2 |
| 7,468,486 B2 * | 12/2008 | Yan | H02G 3/123 |
| | | | 174/50 |
| 7,683,254 B2 * | 3/2010 | Shimizu | H01R 13/719 |
| | | | 174/51 |
| 8,882,517 B2 * | 11/2014 | Smith | H01R 4/64 |
| | | | 439/92 |
| 9,705,260 B2 * | 7/2017 | Aizawa | H01R 4/64 |
| 9,806,438 B2 * | 10/2017 | Duncan | H01R 4/64 |
| 10,476,180 B2 * | 11/2019 | Eckel | H01R 13/44 |
| 2014/0106619 A1 * | 4/2014 | Okamoto | H01R 13/6596 |
| | | | 439/607.58 |
| 2015/0140851 A1 * | 5/2015 | Wang | H01R 13/5205 |
| | | | 439/275 |
| 2018/0001846 A1 * | 1/2018 | Shiratori | B60R 16/023 |
| 2018/0306390 A1 * | 10/2018 | Chami | F21V 23/06 |
| 2020/0112108 A1 * | 4/2020 | Yoshida | H01R 4/308 |
| 2020/0136325 A1 * | 4/2020 | Yoshida | H01R 13/6273 |
| 2020/0136360 A1 * | 4/2020 | Yoshida | H05K 5/0221 |

FOREIGN PATENT DOCUMENTS

| | | |
|---|---|---|
| JP | 2004208429 A | 7/2004 |
| JP | 2013-198330 A | 9/2013 |
| JP | 2013-226019 A | 10/2013 |

\* cited by examiner

ELECTRICAL CONNECTION BOX AND GROUND CONNECTION STRUCTURE THEREOF

CROSS REFERENCE TO RELATED APPLICATIONS

This application is based on and claims priority from Japanese patent application No. 2018-188540 filed on Oct. 3, 2018, the entire contents of which are incorporated herein by reference.

BACKGROUND OF THE INVENTION

1. Technical Field

The present invention relates to an electrical connection box mounted on a vehicle and a ground connection structure thereof.

2. Background Art

An electrical connection box for connecting a battery and various electric devices is mounted on a vehicle (see Patent Literature 1, for example). The electrical connection box is equipped with a circuit board, a bus bar, or the like serving as an electric circuit body. The circuit board and the bus bar are provided with grounding conductor portions.

The grounding conductor portions are connected in an appropriately integrated form, mostly to a ground point outside the electrical connection box, using a conductor wire such as an electric wire. Alternatively, a grounding circuit is incorporated in a connector on an electrical connection box side, and a grounding conductor portion is grounded through a grounding circuit of a mating connector.

SUMMARY

A ground connection completed by preparing a conductor wire such as an electric wire separately from the electrical connection box or incorporating the grounding circuit to the connector makes it easy to increase the number of man-hours and cost in each process of design, manufacture and assembly.

The present invention has been made in view of the above circumstances, and an object thereof is provided an electrical connection box and a ground connection structure thereof, which can perform a ground connection of an electric circuit body only by attaching the electrical connection box to a vehicle body by a bolt, thereby omit a grounding conductor wire, reducing the number of man-hours in each process of design, manufacture and assembly and reducing cost.

In order to achieve the above object, an electrical connection box and a ground connection structure thereof according to the present invention are characterized by the following (1) to (5).

(1) An electrical connection box comprising:
a box main body;
an electric circuit body loaded into the box main body;
a grounding member provided in the electric circuit body;
a belt-like grounding metal plate extending from the grounding member to an outside of the box main body;
a fixing bracket extending integrally with the box main body and including the grounding metal plate; and
a bolt through hole formed through a tip end portion of the fixing bracket to electrically connect the grounding metal plate to a bolt to be inserted.

(2) The electrical connection box according to above (1), wherein the fixing bracket extends in a horizontal direction, and
wherein a slit is provided in an intermediate portion between an end portion of the fixing bracket on a box main body side and an end portion of the fixing bracket on a bolt through hole side.

(3) The electrical connection box according to above (2), wherein the slit is formed so as to have a cutting depth from at least one of upper and lower surfaces of the fixing bracket toward the other surface, and the slit is formed obliquely along a direction inclined downward from the box main body side toward the bolt through hole side.

(4) The electrical connection box according to above (3), wherein a notch is provided at a position of a portion of the grounding metal plate corresponding to the slit.

(5) A ground connection structure of the electrical connection box according to above (1),
wherein the bolt is inserted into the bolt through hole at a tip end portion of the fixing bracket, and the fixing bracket is fastened and fixed to a fixing portion which also serves as a ground point provided on a vehicle body side with the bolt, whereby the grounding metal plate is grounded to the fixing portion.

According to the electrical connection box having the above configuration (1), the bolt is inserted into the bolt through hole at the tip end portion of the fixing bracket, and the fixing bracket is fastened and fixed to the fixing portion which also serves as the ground point provided on the vehicle body side with the bolt, so that the grounding metal plate can be grounded to the fixing portion on the vehicle body side via the bolt. That is, the ground connection of the electric circuit body can be completed only by fixing the fixing bracket of the electrical connection box to the vehicle body with the bolt. Therefore, the conductor wire such as a grounding electric wire can be omitted, and the number of man-hours can be reduced by simplifying each process of the design, manufacture and assembly and the cost can be reduced.

According to the electrical connection box having the above configuration (2), when an excessive external force acts on the electrical connection box due to an impact at the time of a vehicle collision, the intermediate portion (weak portion) of the fixing bracket extending from the box main body is guided to the slit and is preferentially broken. Therefore, it is possible to prevent the electrical connection box from being broken at an unintended portion, and to avoid a danger portion from being exposed due to the breakage of an unintended portion, and to enhance the safety at the time of a vehicle collision.

According to the electrical connection box having the above configuration (3), since the slit is formed obliquely along a direction inclined downward from the box main body side toward the bolt through hole side, when the fixing bracket is broken at a position of the slit upon receiving an impact compression force at the time of a vehicle collision, the bracket broken piece on the box main body side (power source side) gets into a lower side of the bracket broken piece on the bolt through hole side by sliding along a broken surface of the fixing bracket. Therefore, the broken surface of the grounding metal plate on the box main body side is hidden under the bracket broken piece on the bolt through hole side, so that a person can be prevented from touching the broken surface of the grounding metal plate on the box main body side. Therefore, the safety can be enhanced.

According to the electrical connection box having the above configuration (4), since the notch is provided at the position of the portion of the grounding metal plate embedded in the fixing bracket corresponding to the slit, the breakage of the grounding metal plate can be promoted. Therefore, when the fixing bracket is broken, the bracket broken piece on the box main body side can be smoothly get into the lower side of the bracket broken piece on the bolt through hole side. That is, it is possible to prevent the grounding metal plate from being exposed so as to touch a person in a deformed state without being broken.

According to the ground connection structure of the electrical connection box having the above configuration (5), a ground connection of the electric circuit body can be completed only by fixing the fixing bracket of the electrical connection box to the fixing portion on the vehicle body side with the bolt. Accordingly, the conductor wire such as a grounding electric wire can be omitted, and the number of man-hours can be reduced by simplifying each process of the design, manufacture and assembly and the cost can be reduced.

According to the present invention, the ground connection of the electric circuit body can be completed only by fixing the fixing bracket of the electrical connection box to the fixing portion on the vehicle body side with the bolt. Accordingly, the conductor wire such as a grounding electric wire can be omitted, and the number of man-hours can be reduced by simplifying each process of the design, manufacture and assembly and the cost can be reduced.

The present invention has been briefly described above. Further, the details of the present invention will be clarified by reading a mode (hereinafter, referred to as an "embodiment") for carrying out the present invention to be described below with reference to the accompanying drawings.

DETAILED DESCRIPTION OF EMBODIMENTS

A specific embodiment according to the present invention will be described below with reference to the drawings.

Figure 1:
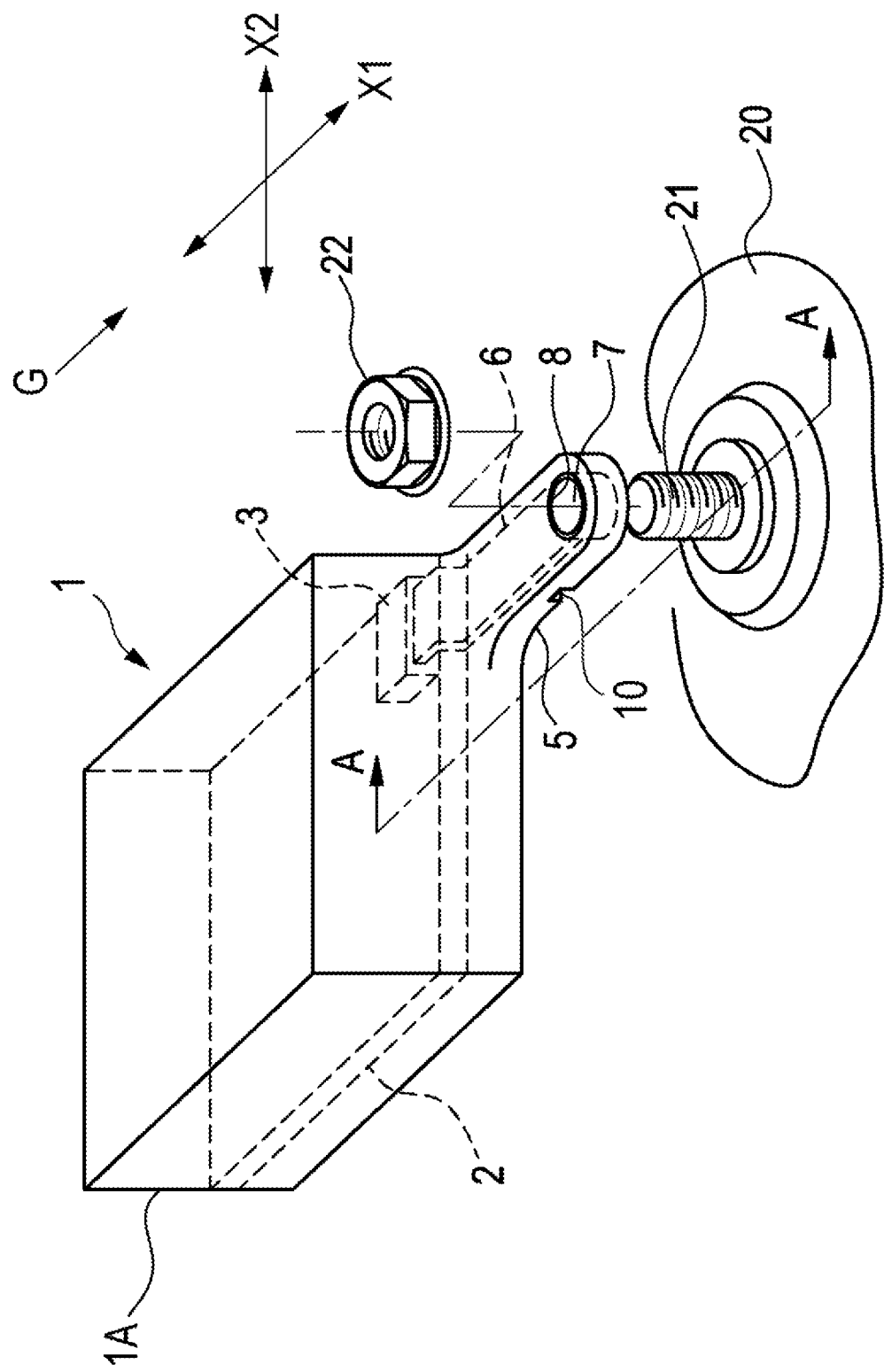
FIG. 1 is a perspective view showing a state before an electrical connection box and a ground connection structure thereof according to an embodiment of the present invention are fixed.
Figure 2A:
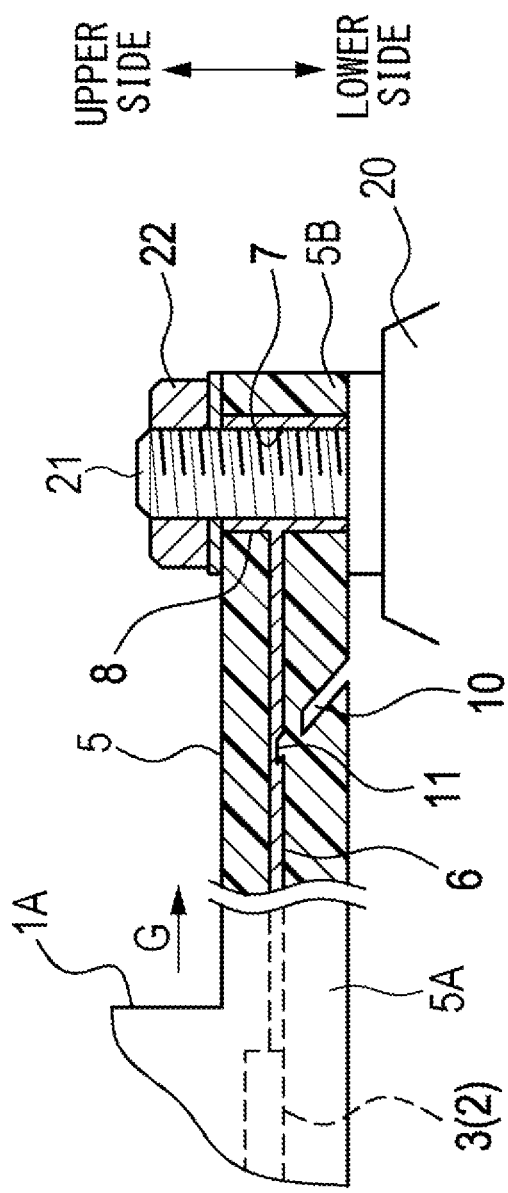
FIG. 2A is a sectional view taken along a line A-A in FIG. 1, which shows a state after the electrical connection box and the ground connection structure thereof are fixed.
Figure 2B:
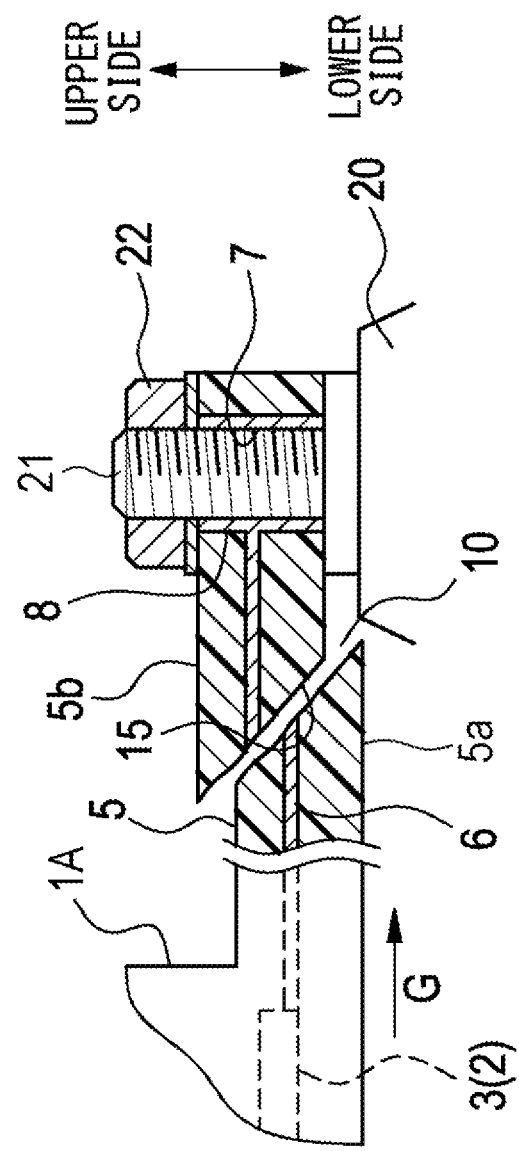
FIG. 2B is a sectional view showing a behavior at break of a portion shown in FIG. 2A.

FIG. 1 is a perspective view showing a state before an electrical connection box and a ground connection structure thereof according to an embodiment of the present invention are fixed. FIG. 2A is a sectional view taken along a line A-A in FIG. 1, which shows a state after the electrical connection box and the ground connection structure thereof are fixed, and FIG. 2B is a sectional view showing a behavior at break of a portion shown in FIG. 2A.

As shown in FIG. 1, an electrical connection box 1 includes a box main body 1A made of resin. The box main body 1A is loaded with an electric circuit body 2 mainly formed of a circuit board, a bus bar, or the like. Various electric elements such as a relay and a fuse are mounted on the electric circuit body 2. In addition, the electric circuit body 2 is provided with a grounding member (grounding conductor portion) 3 configuring a grounding circuit. A belt-like grounding metal plate 6 is extended from the grounding member 3 to the outside of the box main body 1A. In the box main body 1A, an arm-shaped fixing bracket 5 is integrally extended. The fixing bracket 5 is a portion for fixing the electrical connection box 1 to a vehicle body, and the grounding metal plate 6 is embedded inside.

The fixing bracket 5 extends in a horizontal direction in which an impact force at the time of a vehicle collision is applied. A bolt through hole 7 is formed so as to penetrate in an upper-lower direction at a tip end portion of the fixing bracket 5 in an extending direction. The bolt through hole 7 is a penetration hole into which a bolt 21 is inserted when the electrical connection box is fixed. A tip end portion of the grounding metal plate 6 is connected to a cylindrical conductor 8 exposed on an inner periphery of the bolt through hole 7. Therefore, the bolt 21 and the grounding metal plate 6 are electrically connected to each other by inserting the bolt 21 into the bolt through hole 7.

Here, a stud bolt is used as the bolt 21. The bolt 21 is erected on a fixing portion 20 which also serves as a ground point provided on the vehicle body. The fixing bracket 5 is fastened and fixed to the fixing portion 20 on a vehicle body side by inserting the bolt 21 into the bolt through hole 7 at the tip end portion and screwing and tightening a nut 22 from above. As a result, the grounding metal plate 6 is grounded to the fixing portion 20 which also serves as the ground point on the vehicle body side.

As shown in FIG. 2A, at an intermediate portion between an end portion 5A of the fixing bracket 5 on a box main body 1A side and an end portion 5B of the fixing bracket 5 on a bolt through hole 7 side, there is provided a slit 10 for forming a weak portion which is more preferentially broken than the other portions when an impact force G at the time of a vehicle collision acts. As shown in FIG. 1, the slit 10 is formed so as to have a cutting depth from at least one of upper and lower surfaces of the fixing bracket 5 toward the other surface along a horizontal direction X2 orthogonal to a horizontal direction X1 to which the impact force G at the time of a vehicle collision is applied. In the present embodiment, the slit 10 is provided only on the lower surface of the fixing bracket 5.

The slit 10 is formed obliquely along a direction inclined downward from the box main body 1A side toward the bolt through hole 7 side. In addition, at a position of a portion of the grounding metal plate 6 embedded in the fixing bracket 5 corresponding to the slit 10, there is provided a notch 11 which promotes breakage of the grounding metal plate 6 at the time of a vehicle collision. The notch 11 can be easily processed when the grounding metal plate 6 is press-molded.

In order to fix the electrical connection box 1 to the fixing portion 20 which also serves as the ground point of the vehicle body, the bolt 21 is inserted into the bolt through hole 7 at the tip end portion of the fixing bracket 5, and the nut 22 is screwed into an upper portion of the bolt 21 to be tightened. The fixing bracket 5 can be fastened and fixed to the fixing portion 20 which also serves as the ground point provided on the vehicle body side. As a result, the grounding metal plate 6 can be grounded to the fixing portion 20 on the vehicle body side via the bolt 21. That is, a ground connection of the electric circuit body 2 can be completed only by fixing the fixing bracket 5 of the electrical connection box 1 to the vehicle body with the bolt 21. Therefore, a conductor wire such as a grounding electric wire can be omitted, and the number of man-hours can be reduced by simplifying each process of design, manufacture and assembly and cost can be reduced.

As shown in FIG. 2B, when an excessive external force (impact compression force exceeding an allowable value) G acts on the electrical connection box 1 due to an impact at the time of a vehicle collision, the intermediate portion (weak portion) of the fixing bracket 5 extending from the box main body 1A is guided by the slit 10 and is preferentially broken. Therefore, it is possible to prevent the electrical connection box 1 from being broken at an unintended portion, and to avoid a danger portion from being exposed due to the breakage of an unintended portion, and to enhance safety at the time of a vehicle collision.

Particularly, since the slit 10 is formed obliquely along the direction inclined downward from the box main body 1A side toward the bolt through hole 7 side, when the fixing bracket 5 is broken at a position of the slit 10 upon receiving the impact compression force G at the time of a vehicle collision, a bracket broken piece 5a on the box main body side (power source side) gets into a lower side of a bracket broken piece 5b on the bolt through hole 7 side by sliding along a broken surface 15 of the fixing bracket 5. Therefore, the broken surface of the grounding metal plate 6 on the box main body 1A side is hidden under the bracket broken piece 5b on the bolt through hole 7 side, so that a person can be prevented from touching the broken surface of the grounding metal plate 6 on the box main body 1A side. In addition, although the broken surface on the box main body 1A side of the grounding metal plate 6 on the box main body 1A side is directed upward, the broken surface on the box main body 1A side is hidden behind the bracket broken piece 5b on the bolt through hole 7 side, so that it can be prevented from touching the vehicle body. Therefore, the safety can be enhanced.

Since the notch 11 is provided at the position of the portion of the grounding metal plate 6 embedded in the fixing bracket 5 corresponding to the slit 10, the breakage of the grounding metal plate 6 can be promoted. Therefore, when the fixing bracket 5 is broken, the bracket broken piece 5a on the box main body 1A side can get smoothly into the lower side of the bracket broken piece 5b on the bolt through hole 7 side. As a result, it is possible to prevent the grounding metal plate 6 from being exposed so as to touch a person in a deformed state without being broken.

Figure 3:
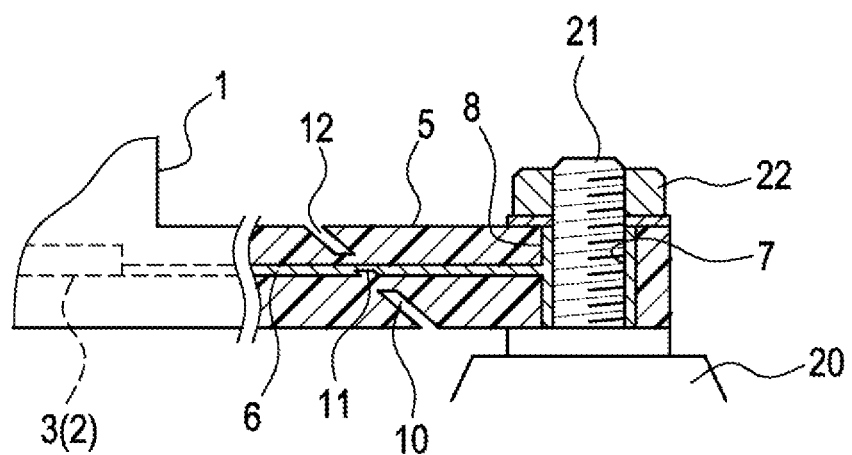
FIG. 3 is a view similar to FIG. 2A in another embodiment of the present invention.

The case where the slit 10 is formed only on the lower surface side of the fixing bracket 5 has been described in the above embodiment, but as in another embodiment shown in FIG. 3, a slit 12 may be provided on an upper surface side of an extension line of the slit 10 on the lower surface side. In addition, the slit 12 may be provided only on the upper surface side. In the case where the slit 10 is formed only on the lower surface side, the slit 10 cannot be seen from above, and thus there is an advantage that appearance is improved.

Figure 4:
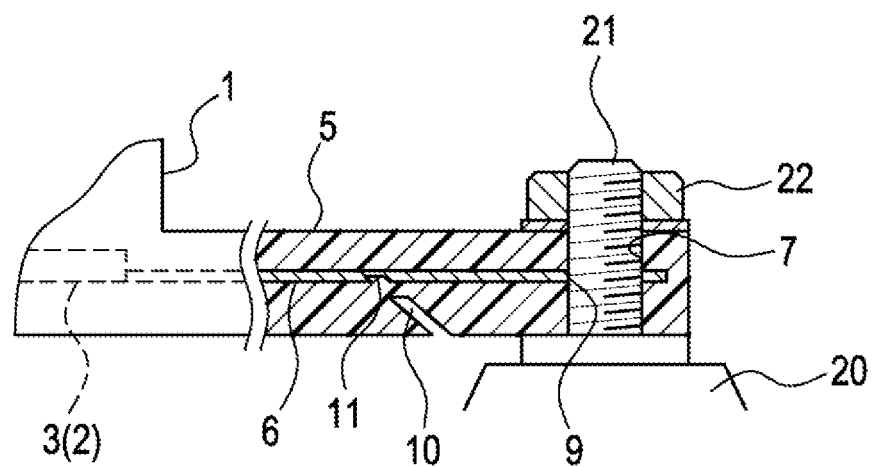
FIG. 4 is a view similar to FIG. 2A in still another embodiment of the present invention.
Figure 5A:
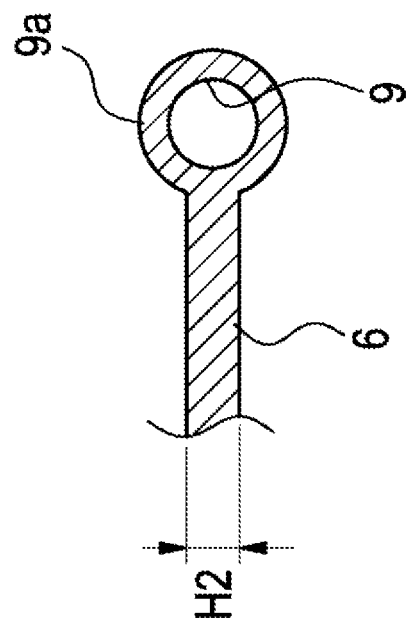
FIGS. 5A and 5B are plan views showing examples of a shape of a tip end portion of a grounding metal plate in the embodiment of FIG. 4.
Figure 5B:
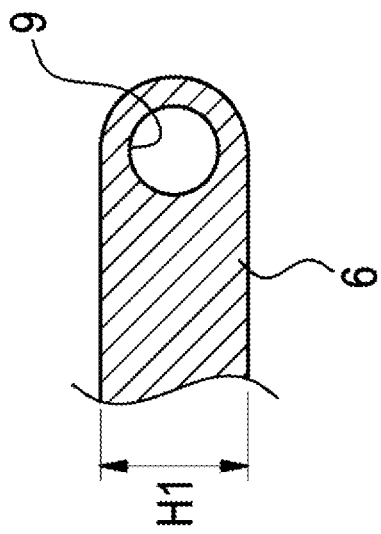

The cylindrical conductor 8 is connected to the tip end portion of the grounding metal plate 6 in the above embodiments, but as in still another embodiment shown in FIG. 4, the cylindrical conductor 8 may be omitted, and a penetration hole 9 whose an inner periphery is exposed on an inner peripheral surface of the bolt through hole 7 may be provided at the tip end portion of the grounding metal plate 6. At this time, as shown in FIG. 5A, the grounding metal plate 6 may have a width H1 such that the penetration hole 9 can be formed, and as shown in FIG. 5B, when a width H2 is smaller, a circular plate portion 9a which can form the penetration hole 9 may be formed at the tip end portion of the grounding metal plate 6.

Here, characteristics of the electrical connection box and the ground connection structure thereof according to the embodiments of the present invention described above are summarized briefly in the following [1] to [5], respectively.

[1] An electrical connection box (1) including:
  a box main body (1A);
  an electric circuit body (2) loaded into the box main body (1A);
  a grounding member (3) provided in the electric circuit body (2);
  a belt-like grounding metal plate (6) extending from the grounding member (3) to an outside of the box main body (1A);
  a fixing bracket (5) extending integrally with the box main body (1A) and including the grounding metal plate (6); and
  a bolt through hole (7) formed through a tip end portion of the fixing bracket (5) to electrically connect the grounding metal plate (6) to a bolt (21) to be inserted.

[2] The electrical connection box (1) according to the above [1],
  wherein fixing bracket (5) extends in a horizontal direction (X1), and
  wherein a slit (10, 12) is provided in an intermediate portion between an end portion (5A) of the fixing bracket (5) on a box main body (1A) side and an end portion (5B) of the fixing bracket (5) on a bolt through hole (7) side.

[3] The electrical connection box (1) according to the above [2],
  wherein the slit (10, 12) is formed so as to have a cutting depth from at least one of upper and lower surfaces of the fixing bracket (5) toward the other surface, and the slit (10, 12) is formed obliquely along a direction inclined downward from the box main body (1A) side toward the bolt through hole (7) side.

[4] The electrical connection box (1) according to the above [3],
  wherein a notch (11) is provided at a position of a portion of the grounding metal plate (6) corresponding to the slit (10, 12).

[5] A ground connection structure of the electrical connection box (1) according to above [1],
  Wherein the bolt (21) is inserted into the bolt through hole (7) at a tip end portion of the fixing bracket (5), and the fixing bracket (5) is fastened and fixed to a fixing portion (20) which also serves as a ground point provided on a vehicle body side with the bolt (21), whereby the grounding metal plate (6) is grounded to the fixing portion (20).

What is claimed is:

1. An electrical connection box comprising:
  a box main body;
  an electric circuit body loaded into the box main body;
  a grounding member provided in the electric circuit body;
  a belt-like grounding metal plate extending from the grounding member to an outside of the box main body;
  a fixing bracket extending integrally with the box main body and including the grounding metal plate; and
  a bolt through hole formed through a tip end portion of the fixing bracket to electrically connect the grounding metal plate to a bolt to be inserted into the bolt through hole in an insertion direction,
  wherein the grounding metal plate is embedded within the fixing bracket such that surfaces of the grounding metal plate are not exposed in the insertion direction.

2. The electrical connection box according to claim 1,
wherein the fixing bracket extends in a horizontal direction, and
wherein a slit is provided in an intermediate portion of the fixing bracket between an end portion of the fixing bracket on a box main body side and an end portion of the fixing bracket on a bolt through hole side, and wherein the slit is disposed below and does not extend beyond the embedded grounding metal plate in the insertion direction.

3. The electrical connection box according to claim 2,
wherein the slit is formed so as to have a cutting depth from at least one of upper and lower surfaces of the fixing bracket toward the other surface, and the slit is formed obliquely along a direction inclined downward from the box main body side toward the bolt through hole side.

4. The electrical connection box according to claim 3,
wherein a notch is formed in a portion of the grounding metal plate corresponding to the slit, the notch extending only partially through the grounding metal plate in the insertion direction of the bolt.

5. A ground connection structure of the electrical connection box according to claim 1,
wherein the bolt is inserted into the bolt through hole at a tip end portion of the fixing bracket, and the fixing bracket is fastened and fixed to a fixing portion which also serves as a ground point provided on a vehicle body side with the bolt, whereby the grounding metal plate is grounded to the fixing portion.

* * * * *